(12) United States Patent
Wang et al.

(10) Patent No.: US 11,502,511 B2
(45) Date of Patent: Nov. 15, 2022

(54) CONTROL METHOD FOR DIRECT CURRENT ELECTRICAL DEVICE AND DIRECT CURRENT ELECTRICAL DEVICE

(71) Applicant: GREE ELECTRIC APPLIANCES, INC. OF ZHUHAI, Zhuhai (CN)

(72) Inventors: Jing Wang, Zhuhai (CN); Shiyong Jiang, Zhuhai (CN); Keqin Liu, Zhuhai (CN); Wu Wen, Zhuhai (CN); Xuefen Zhang, Zhuhai (CN); Peng Ren, Zhuhai (CN)

(73) Assignee: GREE ELECTRIC APPLIANCES, INC. OF ZHUHAI, Zhuhai (CN)

( * ) Notice: Subject to any disclaimer, the term of this patent is extended or adjusted under 35 U.S.C. 154(b) by 0 days.

(21) Appl. No.: 17/270,046

(22) PCT Filed: Jul. 22, 2019

(86) PCT No.: PCT/CN2019/097052
§ 371 (c)(1),
(2) Date: Feb. 22, 2021

(87) PCT Pub. No.: WO2020/103481
PCT Pub. Date: May 28, 2020

(65) Prior Publication Data
US 2021/0344195 A1   Nov. 4, 2021

(30) Foreign Application Priority Data
Nov. 19, 2018   (CN) .......................... 201811378033.4

(51) Int. Cl.
*H02J 1/06*         (2006.01)
*G01R 31/40*        (2020.01)
(Continued)

(52) U.S. Cl.
CPC ................ *H02J 1/06* (2013.01); *G01R 31/40* (2013.01); *G06F 1/26* (2013.01); *H02J 7/00712* (2020.01);
(Continued)

(58) Field of Classification Search
CPC ........ G01R 31/40; H02J 2207/40; H02J 1/06; H02J 7/0063; H02J 7/00712; H02J 7/35;
(Continued)

(56) References Cited

U.S. PATENT DOCUMENTS

2002/0126518 A1   9/2002  Lazarovich
2013/0007473 A1   1/2013  Van Der Lee
(Continued)

FOREIGN PATENT DOCUMENTS

CN    104578388 A    4/2015
CN    106291012 A    1/2017
(Continued)

OTHER PUBLICATIONS

European Patent Office, European Search Report issued in application No. 19886222.9, dated Aug. 27, 2021, Germany, total 9 pages.

*Primary Examiner* — Ryan Johnson
(74) *Attorney, Agent, or Firm* — Kilpatrick Townsend & Stockton, LLP

(57) ABSTRACT

A control method for a direct current electrical device and a direct current electrical device. The method includes: acquiring input parameters of a power supply of the direct current electrical device, identifying a type of the power supply according to the input parameters, and determining an operation mode of the direct current electrical device corresponding to the type of the power supply, and controlling an operation of the direct current electrical device according to the operation mode.

10 Claims, 3 Drawing Sheets

(51) Int. Cl.
*G06F 1/26* (2006.01)
*H02J 7/00* (2006.01)
*H02J 7/35* (2006.01)

(52) U.S. Cl.
CPC ............ *H02J 7/35* (2013.01); *H02J 2207/40* (2020.01); *H02J 2300/26* (2020.01)

(58) Field of Classification Search
CPC .... H02J 2207/20; H02J 7/045; H02J 2300/26; H02J 3/385; G06F 1/26; Y02E 10/56
See application file for complete search history.

(56) References Cited

U.S. PATENT DOCUMENTS

| | | | | |
|---|---|---|---|---|
| 2014/0184160 A1 | 7/2014 | Huang et al. | | |
| 2015/0333553 A1* | 11/2015 | Huang | ................ | H02J 7/0077 320/138 |
| 2019/0131667 A1* | 5/2019 | Huang | ................ | H02J 7/0018 |

FOREIGN PATENT DOCUMENTS

| | | |
|---|---|---|
| CN | 106899078 A | 6/2017 |
| CN | 108258810 A | 7/2018 |
| CN | 108599530 A | 9/2018 |
| CN | 108767884 A | 11/2018 |
| CN | 109507506 A | 3/2019 |
| WO | 2013073126 A1 | 5/2013 |
| WO | 2015175120 A1 | 11/2015 |

* cited by examiner

CONTROL METHOD FOR DIRECT CURRENT ELECTRICAL DEVICE AND DIRECT CURRENT ELECTRICAL DEVICE

CROSS REFERENCE TO RELATED APPLICATIONS

This application is a U.S. National Stage of International Application No PCT/CN2019/097052, filed on Jul. 22, 2019, which claims priority to Chinese Patent Application No. 201811378033.4, filed on Nov. 19, 2018, entitled "CONTROL METHOD FOR DIRECT CURRENT ELECTRICAL DEVICE AND DIRECT CURRENT ELECTRICAL DEVICE", the entire content of which is incorporated herein in its entirety.

FIELD

The present disclosure relates to a field of direct current electrical device, and in particularly, relates to a control method for a direct current electrical device, and a direct current electrical device.

BACKGROUND

At present, high-voltage direct current transmission technology is being closely implemented. Direct current (DC) distribution networks and DC electrical devices are also current research focus, and represent the development direction of DC transmission, DC distribution, and DC power consumption.

For DC power device, the progress of research, development and promotion of the DC electrical devices is also very fast. Currently, many DC electrical devices have appeared in the market. However, the existing DC electrical devices are mainly concentrated in some special application conditions, such as those powered by a single battery, or directly connected to a DC power supply line of some systems, or directly connected to a photovoltaic power generation system. DC electrical devices like these also operate in specific conditions. If the DC electrical devices are directly changed to operate in other workplaces, they will not operate normally, or operating efficiency thereof will be greatly reduced, which is a great disadvantage for the universality of the DC electrical devices.

In view of the problems that available power supplies for the DC electrical devices in related art are fixed, and that the DC electrical devices have low universality, no effective solutions have been proposed yet.

SUMMARY

The present disclosure provides a control method for a direct current electrical device and a direct current electrical device to address the problems that available power supplies for the direct current electrical device in related art are fixed, and that the DC electrical device has low universality.

The embodiments of the present disclosure disclose a control method for a direct current electrical device is provided, and the method includes: obtaining input parameters of a power supply of the direct current electrical device, identifying a type of the power supply according to the input parameters, and determining an operation mode of the direct current electrical device corresponding to the type of the power supply, and controlling an operation of the direct current electrical device according to the operation mode.

In one embodiment, the input parameters of the power supply include at least an input voltage and an input power. The identifying the type of the power supply according to the input parameters includes: adjusting the input voltage, detecting whether the input power changes, and determining the type of the power supply according to whether the input power changes.

In one embodiment, the type of the power supply includes an adjustable power supply and a non-adjustable power supply. The adjustable power supply is a photovoltaic power. The non-adjustable power supply is a battery or a DC busbar.

In one embodiment, the determining the type of the power supply according to whether the input power changes includes: when the input power changes, determining the type of the power supply as the adjustable power supply, and when the input power remains unchanged, determining the type of the power supply as the non-adjustable power supply.

In one embodiment, the operation mode includes an adjustable mode and a fixed mode.

In one embodiment, the determining the operation mode of the direct current electrical device corresponding to the type of the power supply includes: when the type of the power supply is the adjustable power supply, determining the operation mode as the adjustable mode, and when the type of the power supply is the non-adjustable power supply, determining the operation mode as the fixed mode.

In one embodiment, the controlling the operation of the direct current electrical device according to the operation mode includes: when the operation mode is the adjustable mode, detecting the input parameters of the power supply in real time, determining real-time operating parameters of the direct current electrical device according to the input parameters, and controlling the operation of the direct current electrical device according to the real-time operating parameters, when the operation mode is the fixed mode, determining the operating parameters of the direct current electrical device as common operating parameters of the direct current electrical device according to the input parameters of the power supply, and controlling the operation of the direct current electrical device according to the common operating parameters.

According to another aspect of the embodiments of the present disclosure, a direct current electrical device is provided, and includes: an energy source characteristic identification device configured to obtain input parameters of a power supply of the direct current electrical device, and identify a type of the power supply according to the input parameters, and an operation mode configuration device configured to determine an operation mode of the direct current electrical device corresponding to the type of the power supply, and control an operation of the direct current electrical device according to the operation mode.

In one embodiment, the direct current electrical device further includes a direct current interface configured to receive an external direct current power supply, and a direct current electrical device body configured to realize kinetic energy of the direct current electrical device.

In one embodiment, the input parameters of the power supply include at least an input voltage and an input power. The energy source characteristic identification device includes: an adjusting device configured to adjust the input voltage, a detecting device configured to detect whether the input power changes, and a determining device configured to determine the type of the power supply according to whether the input power changes.

In one embodiment, the type of the power supply includes an adjustable power supply and a non-adjustable power supply. The operation mode configuration device includes: a first operation mode determining device configured to determine the operation mode as an adjustable mode when the type of the power supply is the adjustable power supply; a second operation mode determining device configured to determine the operation mode as a fixed mode when the type of the power supply is the non-adjustable power supply; a first controlling device configured to, when the operation mode is the adjustable mode, detect the input parameters of the power supply in real time, determine real-time operating parameters of the direct current electrical device according to the input parameters, and control the operation of the direct current electrical device according to the real-time operating parameters; and a second controlling device configured to, when the operation mode is the fixed mode, determine operating parameters of the direct current electrical device as common operating parameters of the direct current electrical device according to the input parameters of the power supply, and control the operation of the direct current electrical device according to the common operating parameters.

According to yet another aspect of the embodiments of the present disclosure, a computer device is provided, and includes a memory, a processor, and computer programs stored in the memory and executed by the processor. The programs, when executed by the processor, cause the processor to perform the control method for the direct current electrical device described above.

According to yet another aspect of the embodiments of the present disclosure, a storage medium containing computer executable instructions is provided. The computer executable instructions, when executed by a computer processor, cause the computer processor to perform the control method for the direct current electrical device as described above.

In the present disclosure, the input parameters of the power supply of the DC electrical device are obtained, the type of the power supply is identified according to the input parameters, and the operation mode of the DC electrical device corresponding to the type of the power supply is determined, and the operation of the DC electrical device is controlled according to the operation mode. By means of such a control method, the universality of the DC electrical device can be greatly improved. In a condition whether the DC voltage is adjustable or non-adjustable, the DC electrical device can perform the identification, and the operation mode is automatically configured to achieve the optimal operating state.

DETAILED DESCRIPTION OF THE EMBODIMENTS

Exemplary embodiments will be described in detail herein, and examples thereof are shown in the accompanying drawings. When the following description refers to the accompanying drawings, unless otherwise indicated, identical reference signs in different drawings represent the same or similar elements. The embodiments described in the exemplary embodiments below do not represent all implementations consistent with the present disclosure. On the contrary, they are only examples of devices and methods consistent with some aspects of the present disclosure described in detail in the appended claims.

First Embodiment

Figure 1:
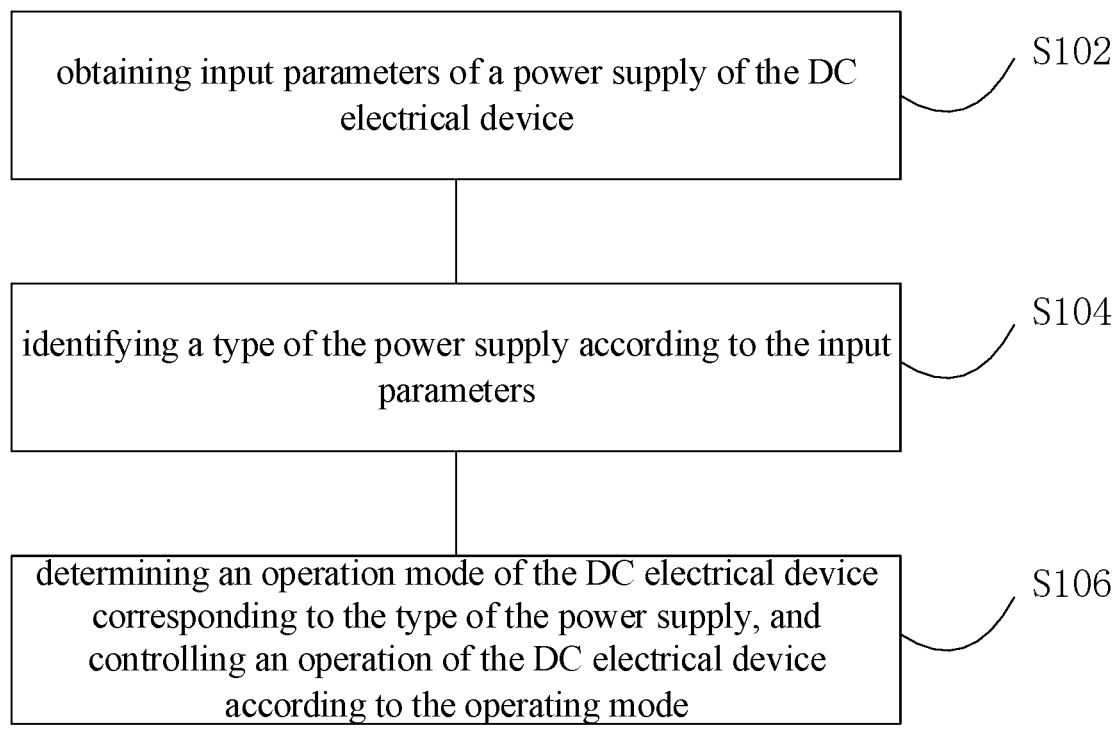
FIG. 1 is a flowchart of a control method for a direct current electrical device according to an embodiment of the present disclosure.

In a first embodiment of the present disclosure, a control method for a direct current (DC) electrical device is provided. The control method is directly applied to various DC electrical devices or other devices with partial functions of the DC electrical devices. In one embodiment, the method is implemented by installing software or an APP on the DC electrical device or other devices, or writing corresponding programs into a controller. In one embodiment, FIG. 1 shows an optional flowchart of the method. As shown in FIG. 1, the method includes the following steps S102 to S106.

S102: Obtaining input parameters of a power supply of a DC electrical device;

S104: Identifying a type of the power supply according to the input parameters; and S106: Determining an operation mode of the DC electrical device corresponding to the type of the power supply, and controlling an operation of the DC electrical device according to the operation mode.

In the foregoing embodiment, the input parameters of the power supply of the DC electrical device are obtained, the type of the power supply is identified according to the input parameters, and the operation mode of the DC electrical device corresponding to the type of the power supply is determined, and the operation of the DC electrical device is controlled according to the operation mode. By means of such a control method, the universality of the DC electrical device can be greatly improved. In a condition whether the DC voltage is adjustable or non-adjustable, the DC electrical device can perform the identification, and the operation mode is automatically configured to achieve the optimal operating state.

In some embodiments of the present disclosure, the input parameters of the power supply include at least an input voltage and an input power. The identifying the type of the power supply according to the input parameters includes adjusting the input voltage, detecting whether the input power changes, and determining the type of the power supply according to whether the input power changes.

The DC electrical device is currently widely used in a new energy field and other DC power supply fields. In different application conditions, different DC power supplies have different output characteristics. For example, power-voltage (P-V) output characteristics of the photovoltaic panel have a characteristic curve low at two ends and high in the middle. The output power has a smaller output when the voltage is smaller. As the voltage increases, the output power gradually increases, and the output power reaches the maximum when the voltage reaches a value, then, as the voltage continues to increase, the output power decreases instead. This is a unique output curve of the photovoltaic panel. The output characteristic curve of an energy storage battery or a DC busbar is represented by a stable straight line. Along with a gradual release of energy, the voltage of the battery slowly decreases. The output voltage of the battery is only related to its own characteristics and has no relation with a load. Therefore, if the DC electrical device cannot identify a type and output characteristics of the energy source and cannot configure the operation mode according to different types of the energy source, it is difficult for the DC electrical device to operate in the most efficient state.

It is known from the above analysis that the input parameters of the DC electrical device are divided into an adjustable type and a non-adjustable type. An adjustable power supply is a photovoltaic power. A non-adjustable power supply is a battery or a DC busbar.

According to the characteristics of the input parameters of the power supply, the power of the adjustable power supply changes as the voltage changes, while the power of the non-adjustable power supply does not change as the voltage changes. Therefore, the determining the type of the power supply according to whether the input power changes includes: when the input power changes, determining the type of the power supply as the adjustable power supply; and when the input power remains unchanged, determining the type of the power supply as the non-adjustable power supply.

After identifying the type of the power supply, the operation modes of the DC electrical device corresponding to different types of power supply are determined, and the operation modes include an adjustable mode and a fixed mode. When the type of the power supply is the adjustable power supply, the operation mode is determined as the adjustable mode. When the type of the power supply is the non-adjustable power supply, the operation mode is determined as the fixed mode.

When the operation mode is the adjustable mode, the input parameters of the power supply are detected in real time. Real-time operating parameters of the DC electrical device are determined according to the input parameters. The operation of the DC electrical device is controlled according to the real-time operating parameters. In some embodiments, a maximum power point tracking (MPPT) control is adopted to control the operation of the DC electrical device, improving operating efficiency of the system.

When the operation mode is the fixed mode, the operating parameters of the DC electrical device are determined to be common operating parameters of the DC electrical device according to the input parameters of the power supply. The operation of the DC electrical device is controlled according to the common operating parameters. Since the common operating parameters are determined according to the unchanged parameters of the power supply, the common operating parameters, as fixed operating parameters, can prevent conflicts in control.

Figure 2:
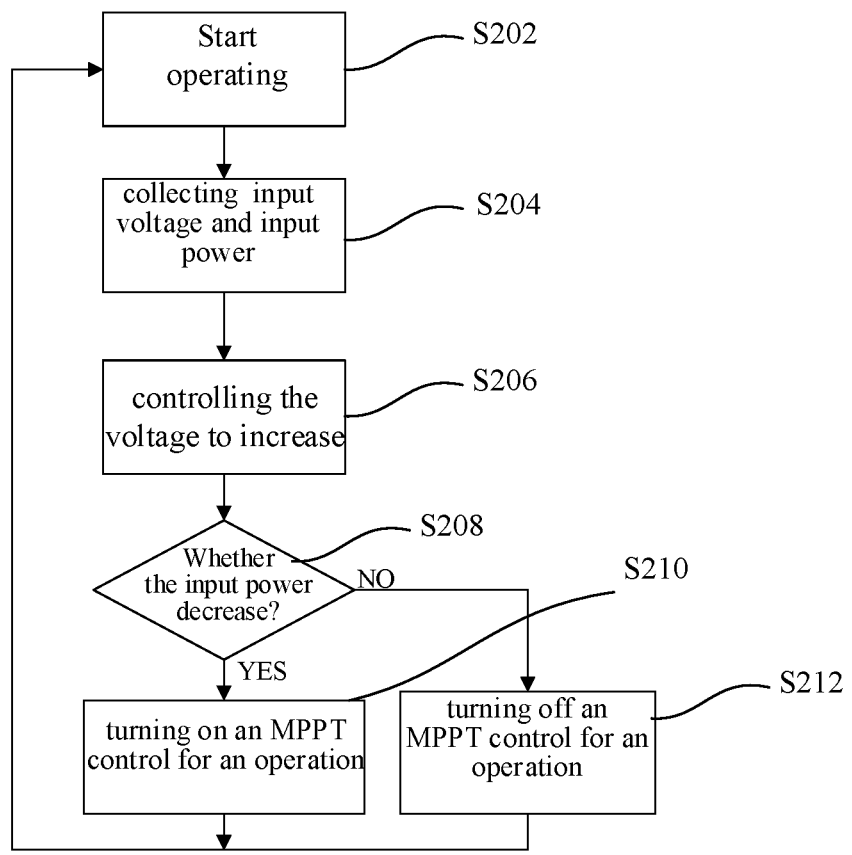
FIG. 2 is another flowchart of a control method for the direct current electrical device according to an embodiment of the present disclosure.

In the first embodiment of the present disclosure, another control method for the DC electrical device is further provided. FIG. 2 shows an optional flowchart of the method. As shown in FIG. 2, the method includes the following steps S202 to S212.

S202: Start operating;
S204: Collecting a DC input voltage and a DC input power;
S206: Controlling the DC input voltage to increase;
S208: Detecting whether the input power decreases; if yes, proceeding step S210; if not, proceeding step S212;
S210: Turning on an MPPT control for an operation; then returning to step S202; and
S212: Turning off an MPPT control for an operation; then returning to step S202.

In the foregoing embodiment, the input parameters of the power supply of the DC electrical device are obtained, the type of the power supply is identified according to the input parameters, and the operation mode of the DC electrical device corresponding to the type of the power parameters, and the operation mode of the DC electrical device corresponding to the type of the power supply is determined, and the operation of the DC electrical device is controlled according to the operation mode. After the DC electrical device is controlled in this way, the universality of DC electrical device is greatly improved. In the condition whether the DC voltage is adjustable or non-adjustable, the DC electrical device can perform the identification, and the operation mode is automatically configured, achieving the optimal operating state.

When the DC electrical device starts to operate, firstly, the DC input voltage and the DC input power are collected. Then, the DC input voltage is controlled to increase by means of an internal DC/DC circuit, to detect whether the input power decreases, or whether the input power increases. If yes, it reveals that the type of the connected energy source is adjustable, then an adjustable operation mode may be performed, and the MPPT control is turned on to control the operation, improving the operating efficiency of the system. If the input power remains unchanged, and the input voltage is not adjustable to a extent, it reveals that the type of the connected energy source, for example, a constant voltage power supply device such as a battery, has non-adjustable voltage. Then, the MPPT control for the operation is turned off, to prevent conflicts in control.

By adding the function of identifying the type of the energy source, the DC electrical device can identify different types of the energy source. For different types of energy sources, the DC electrical device can automatically configure the operation mode according to the identified type of the energy source, effectively solving the problem that the available power supplies of the DC electrical device are fixed, and that the universality of the DC electrical is low, and improving the universality of the DC electrical device.

Second Embodiment

Based on the method of the foregoing first embodiment, a DC electrical device is further provided in a second embodiment of the present disclosure. In one embodiment, FIG. 3 shows an optional block diagram of the DC electrical device.

Figure 3:
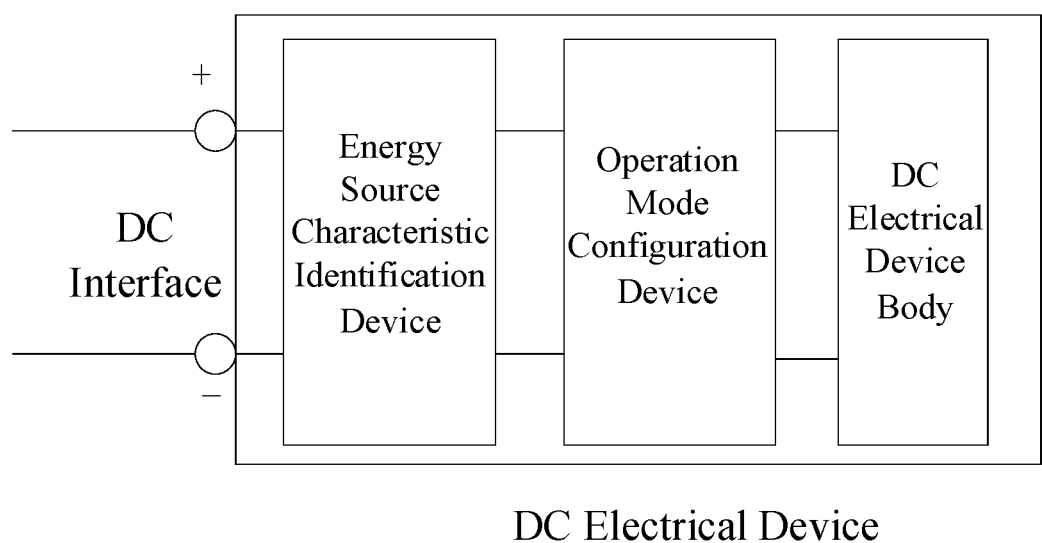
FIG. 3 is a block diagram of the direct current electrical device according to an embodiment of the present disclosure.

As shown in FIG. 3, the DC electrical device includes: an energy source characteristic identification device configured to obtain input parameters of a power supply of the DC electrical device, and identify a type of the power supply according to the input parameters. During a promotion process of the DC electrical device, it is very necessary to improve the universality of the DC electrical device, therefore, the energy source characteristic identification device needs to be integrated in the DC electrical device, to identify different types of energy sources, and automatically configure its own operation mode according to different transmission characteristics, matching the best operating state.

The DC electrical device also includes: an operation mode configuration device configured to determine an operation mode of the DC electrical device corresponding to the type of the power supply, and control an operation of the DC electrical device according to the operation mode thereof.

In the foregoing embodiment, the input parameters of the power supply of the DC electrical device are obtained, the type of the power supply is identified according to the input parameters, and the operation mode of the DC electrical device corresponding to the type of the power supply is determined, and the operation of the DC electrical device is controlled according to the operation mode. After the DC electrical device is controlled in this way, the universality of the DC electrical device is greatly improved. In a condition whether the DC voltage is adjustable or non-adjustable, the DC electrical device can perform the identification, and the operation mode is automatically configured to achieve the optimal operating state.

The DC electrical device further includes: a DC interface configured to receive an external DC power supply, and a DC electrical device body configured to realize the kinetic energy of the DC electrical device.

In some implementations of the present disclosure, the input parameters of the power supply include at least an input voltage and an input power. The energy source characteristic identification device includes: an adjusting device configured to adjust the input voltage, where the adjusting device may be implemented by a DC/DC circuit, a detecting device configured to detect whether the input power changes, and a determining device configured to determine the type of the power supply according to whether the input power changes.

The input parameters of the DC electrical device are divided into adjustable type and non-adjustable type. An adjustable power supply is a photovoltaic power supply. A non-adjustable power supply is a battery or a DC busbar.

According to the characteristics of the input parameters of the power supply, the power of the adjustable power supply changes as the voltage changes, while the power of the non-adjustable power supply does not change as the voltage changes. Therefore, the determining device includes: a first determining sub-device configured to determine the type of the power supply as the adjustable power supply when the input power changes, and a second determining sub-device configured to determine the type of the power supply as the non-adjustable power supply when the input power remains unchanged.

After the type of the power supply is identified, the operation modes of the DC electrical device corresponding to different types of power supply are In one embodiment determined, and the operation modes include an adjustable mode and a fixed mode. The operation mode configuration device includes: a first operation mode determining device configured to determine that the operation mode is the adjustable mode when the type of the power supply is the adjustable power supply, and a second operation mode determining device configured to determine that the operation mode is the fixed mode when the type of the power supply is the non-adjustable power supply.

The operation mode configuration device further includes a first controlling device. The first controlling device is configured to, when the operation mode is the adjustable mode, detect the input parameters of the power supply in real time, determine real-time operating parameters of the DC electrical device according to the input parameters, and control the operation of the DC electrical device according to the real-time operating parameters. In some embodiments, a MPPT control is adopted to control the operation of the DC electrical device, improving operating efficiency of the system. The operation mode configuration device further also includes a second controlling device. The second controlling device is configured to, when the operation mode is the fixed mode, determine the operating parameters of the DC electrical device to be common operating parameters of the DC electrical device according to the input parameters of the power supply, and control the operation of the DC electrical device according to the common operating parameters. Since the common operating parameters are determined according to the unchanged parameters of the power supply, the common operating parameters, as fixed operating parameters, can prevent conflicts in control.

By adding the function of identifying the type of the energy source, the DC electrical device can identify different types of the energy source. For different types of energy sources, the DC electrical device can automatically configure the operation mode according to the identified type of the energy source, effectively solving the problem that the available power supplies of the DC electrical device are fixed, and that the universality of the DC electrical is low, and improving the universality of the DC electrical device.

Regarding the device of the foregoing embodiment, the specific means by which each device and each device perform operations have been described in detail in the embodiments of the related method, which will not be elaborated herein.

Third Embodiment

Based on the control method for the DC electrical device of the foregoing first embodiment, a computer device is further provided in the third embodiment of the present disclosure. The computer device includes a memory, a processor, and computer programs stored in the memory and executable by the processor. The programs, when executed by the processor, cause the processor to perform the control method for the DC electrical device as described above.

In the foregoing embodiment, input parameters of the power supply of the DC electrical device are obtained. The type of the power supply is identified according to the input parameters, and the operation mode of the DC electrical device corresponding to the type of the power supply is determined. The operation of the DC electrical device is controlled according to the operation mode. After the DC electrical device is controlled in this way, the universality of the DC electrical device is greatly improved. In a condition whether the DC voltage is adjustable or non-adjustable, the DC electrical device can perform the identification, and the operation mode is automatically configured, achieving the optimal operating state.

Fourth Embodiment

Based on the control method for the DC electrical device of the foregoing first embodiment, a storage medium containing computer executable instructions is further provided in the fourth embodiment of the present disclosure. The computer executable instructions, when executed by a computer processor, cause the computer processor to perform the control method for the DC electrical device as described above.

In the foregoing embodiment, input parameters of the power supply of the DC electrical device are obtained. The type of the power supply is identified according to the input parameters, and the operation mode of the DC electrical device corresponding to the type of the power supply is determined. The operation of the DC electrical device is controlled according to the operation mode. After the DC electrical device is controlled in this way, the universality of the DC electrical device is greatly improved. In a condition whether the DC voltage is adjustable or non-adjustable, the DC electrical device can perform the identification, and the operation mode is automatically configured, achieving the optimal operating state.

Other embodiments of the present disclosure will be apparent from considering the description and practicing the disclosure disclosed herein. This disclosure intends to cover any variations, uses, or adaptive changes of the present disclosure. These variations, uses, or adaptive changes follow the general principles of the present disclosure and encompass common knowledge or conventional means in the field which are not disclosed by the present disclosure. The description and the embodiments are to be considered exemplary only, and the true scope and spirit of the present disclosure are defined by the appended claims.

It should be understood that the present disclosure is not limited to the precise structures described above and shown in the accompanying drawings, and various modifications and changes can be made without departing from the scope of the present disclosure. The scope of the present disclosure is limited only by the appended claims.

INDUSTRIAL APPLICABILITY

The solutions provided by the embodiments of the present disclosure is used to determine the operation mode of the DC electrical device corresponding to the type of the power supply, and control the operation of the DC electrical device according to the determined operation mode. The embodiments of the present disclosure can be applied to the DC electrical device. During the operation of the DC electrical device, the input parameters of the power supply of the DC electrical device are obtained. The type of the power supply is identified according to the input parameters, and the operation mode of the DC electrical device corresponding to the type of the power supply is determined. The operation of the DC electrical device is controlled according to the operation mode. By means of such a controlling method, the universality of the DC electrical device is greatly improved. In a condition whether the DC voltage is adjustable or non-adjustable, the DC electrical device can perform the identification, and the operation mode is automatically configured, achieving the optimal operating state.

What is claimed is:

1. A control method for a direct current electrical device, comprising:
   obtaining input parameters of a power supply of the direct current electrical device, the input parameters of the power supply comprising at least an input voltage and an input power;
   adjusting the input voltage;
   detecting whether the input power changes;
   determining the type of the power supply according to whether the input power changes, the type of the power supply comprising an adjustable power supply and a non-adjustable power supply; and
   determining an operation mode of the direct current electrical device corresponding to the type of the power supply, comprising:
      when the type of the power supply is an adjustable power supply, determining the operation mode as the adjustable mode;
      when the type of the power supply is a non-adjustable power supply, determining the operation mode as the fixed mode;
   and
   controlling an operation of the direct current electrical device according to the operation mode, comprising:
      when the operation mode is the adjustable mode, detecting the input parameters of the power supply in real time, determining real-time operating parameters of the direct current electrical device according to the input parameters, and controlling the operation of the direct current electrical device according to the real-time operating parameters; and
      when the operation mode is the fixed mode, determining the operating parameters of the direct current electrical device as common operating parameters of the direct current electrical device according to the input parameters of the power supply, and controlling the operation of the direct current electrical device according to the common operating parameters.

2. The control method according to claim 1, wherein: the adjustable power supply is a photovoltaic power; and the non-adjustable power supply is a battery or a DC busbar.

3. The control method according to claim 2, wherein the determining the type of the power supply according to whether the input power changes comprises:
   when the input power changes, determining the type of the power supply as the adjustable power supply; and
   when the input power remains unchanged, determining the type of the power supply as the non-adjustable power supply.

4. A computer device, comprising a memory, a processor, and computer programs stored in the memory and executable by the processor, wherein the programs, when executed by the processor, cause the processor to perform the control method for the direct current electrical device according to claim 1.

5. A non-transitory computer readable medium containing computer executable instructions, wherein the computer executable instructions, when executed by a processor, cause the computer processor to perform the control method for the direct current electrical device according to claim 1.

6. The control method according to claim 1, wherein the controlling the operation of the direct current electrical device according to the common operating parameters comprises: controlling the operation of the direct current electrical device by means of a maximum power point tracking (MPPT) control according to the common operating parameters.

7. A direct current electrical device, comprising:
   an energy source characteristic identification device configured to obtain input parameters of a power supply of the direct current electrical device, the input parameters of the power supply comprising at least an input voltage and an input power, the energy source characteristic identification device comprising: an adjusting device configured to adjust the input voltage; a detecting device configured to detect whether the input power changes; and a determining device configured to determine the type of the power supply according to whether the input power changes, the type of the power supply comprising an adjustable power supply and a non-adjustable power supply; and
   an operation mode configuration device configured to determine an operation mode of the direct current electrical device corresponding to the type of the power supply, and control an operation of the direct current electrical device according to the operation mode, wherein the operation mode configuration device comprises:

a first operation mode determining device configured to determine the operation mode as an adjustable mode when the type of the power supply is an adjustable power supply;

a second operation mode determining device configured to determine the operation mode as a fixed mode when the type of the power supply is a non-adjustable power supply;

a first controlling device configured to, when the operation mode is the adjustable mode, detect the input parameters of the power supply in real time, determine real-time operating parameters of the direct current electrical device according to the input parameters, and control the operation of the direct current electrical device according to the real-time operating parameters; and a second controlling device configured to, when the operation mode is the fixed mode, determine operating parameters of the direct current electrical device as common operating parameters of the direct current electrical device according to the input parameters of the power supply, and control the operation of the direct current electrical device according to the common operating parameters.

8. The direct current electrical device according to claim 7, wherein the adjusting device is a DC/DC circuit.

9. The direct current electrical device according to claim 7, wherein the adjustable power supply is a photovoltaic power supply, and the non-adjustable power supply is a battery or a DC busbar.

10. The direct current electrical device according to claim 7, wherein the determining device comprises:

a first determining sub-device configured to determine the type of the power supply as an adjustable power supply when the input power changes, and a second determining sub-device configured to determine the type of the power supply as a non-adjustable power supply when the input power remains unchanged.

* * * * *